(12) United States Patent
Kawano et al.

(10) Patent No.: US 6,570,772 B2
(45) Date of Patent: May 27, 2003

(54) PORTABLE TERMINAL DEVICE

(75) Inventors: Kazumi Kawano, Fukuoka (JP); Takashi Yamaguchi, Fukuoka (JP); Naoki Koga, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/860,917

(22) Filed: May 18, 2001

(65) Prior Publication Data

US 2002/0021559 A1 Feb. 21, 2002

(30) Foreign Application Priority Data

May 19, 2000 (JP) ........................................ 2000-147713

(51) Int. Cl.⁷ ................................................ H05K 5/04
(52) U.S. Cl. .................. 361/752; 361/816; 361/797; 361/796; 361/800; 174/35; 174/51 R
(58) Field of Search ................................. 361/752, 796, 361/816, 714, 800, 774, 784, 799, 813, 702, 729; 174/35 R, 51 R

(56) References Cited

U.S. PATENT DOCUMENTS

| 4,872,091 A | * | 10/1989 | Maniwa et al. ................ 174/51 |
| 5,519,577 A | * | 5/1996 | Dudas et al. ............ 174/35 GC |
| 5,603,103 A | * | 2/1997 | Halttunen et al. ......... 174/35 R |
| 5,673,182 A | * | 9/1997 | Garner ......................... 361/829 |
| 5,896,274 A | * | 4/1999 | Ishida ........................... 361/737 |
| 6,049,468 A | * | 4/2000 | Learmonth .............. 174/35 GC |
| 6,134,114 A | * | 10/2000 | Ungermann et al. ........ 235/486 |
| 6,162,070 A | * | 12/2000 | Yu et al. ...................... 439/108 |

* cited by examiner

Primary Examiner—Jayprakash N. Gandhi
Assistant Examiner—Hung Bui
(74) Attorney, Agent, or Firm—RatnerPrestia

(57) ABSTRACT

A portable terminal device having: a circuit board having electronic component mounted thereon; a frame for receiving said circuit board therein; a reinforcement member in contact with the frame and for reinforcing the frame; and a cover fitted to the frame. For the device, improvement in the rigidity of the frame can prevent its breakage and resulting kinks or bends of the circuit board, and thus improve reliability of the microconnection between the electronic component and circuit board.

17 Claims, 16 Drawing Sheets

PORTABLE TERMINAL DEVICE

FIELD OF THE INVENTION

The present invention relates to reinforcement of the structures of portable terminal devices, such as a PC (personal computer) card.

BACKGROUND OF THE INVENTION

FIG. 15 shows a perspective exploded view of a conventional PC card during assembly thereof, as an example of conventional portable terminal devices. Reference numeral 1 indicates a top cover with holes 7a to 7d formed therethrough. Reference numeral 3 indicates a connector for connection to external equipment, reference numeral 4 indicates a circuit board having connector 3 attached thereto, and reference numeral 5 indicates a frame for receiving circuit board 4 therein. Reference numeral 5a indicates a bracket member extending between opposing sides of frame 5. Reference numerals 6a to 6d indicate bosses provided at the positions corresponding to respective holes 7a to 7d, and reference numeral 8 indicates a fitting part for receiving connector 3 therein. Reference numeral 9 indicates a bottom cover fitting a frame 5 and reference numeral 10 indicates an adhesive tape for bonding bottom cover 9 and frame 5 together and provided on the bottom cover so as substantially correspond to the shape of frame 5. Reference numerals 11a to 11d indicate screws for securing to cover 1 and frame 5 together. The steps taken in assembling the PC card are described below. 1) Fit circuit board 4 having connector 3 attached thereto into frame 5 so that fitting part 8 receives connector 3 as shown in FIG. 16. 2) Fit top cover 1 to frame 5 so that holes 7a to 7d correspond to bosses 6a to 6d, respectively. Then secure to cover 1 to frame 5 using screws 11a to 11d. 3) Bond adhesive tape 10 to frame 5 so that bottom cover 9 is fitted and secured to frame 5 on the opposite side of top cover 1. The PC card constructed as above is connected to electronic equipment such as a personal computer via connector 3 to impart user's intended value-added functions to the electronic equipment, or to be used as external memory means. Moreover, being portable, such a PC card can be used for the electronic equipment at anytime and any place, both indoors and outdoors, with the above-mentioned functions imparted. PC cards must have a mechanical strength sufficient to resist external force applied thereto when used or carried. Since recent higher packaging density of electronic component has necessitated extremely minuscule connection between electronic component and a circuit board, PC cards are desired to have higher mechanical strength. The present invention aims to provide a portable terminal device in which reinforcement of its frame prevents breakage of the frame as well as resulting kinks and bends of its circuit board and improves reliability in microconnection between its electronic component and circuit board.

SUMMARY OF THE INVENTION

The portable terminal device of the present invention has a circuit board having electronic component mounted thereon, a frame for receiving the circuit board therein, a reinforcement member in contact with and for reinforcing the frame, and a cover fitted to the frame. Since the reinforcement member supports the frame, shocks to the frame, kinks and bends of the circuit board, force applied to the connection between the electronic component and the circuit board are reduced when the portable terminal device undergoes external force. Therefore, such a structure can provide a portable terminal device with improved mechanical strength and reliability of connection between its electronic component and circuit board.

DETAILED DESCRIPTION OF THE INVENTION

Figure 1:
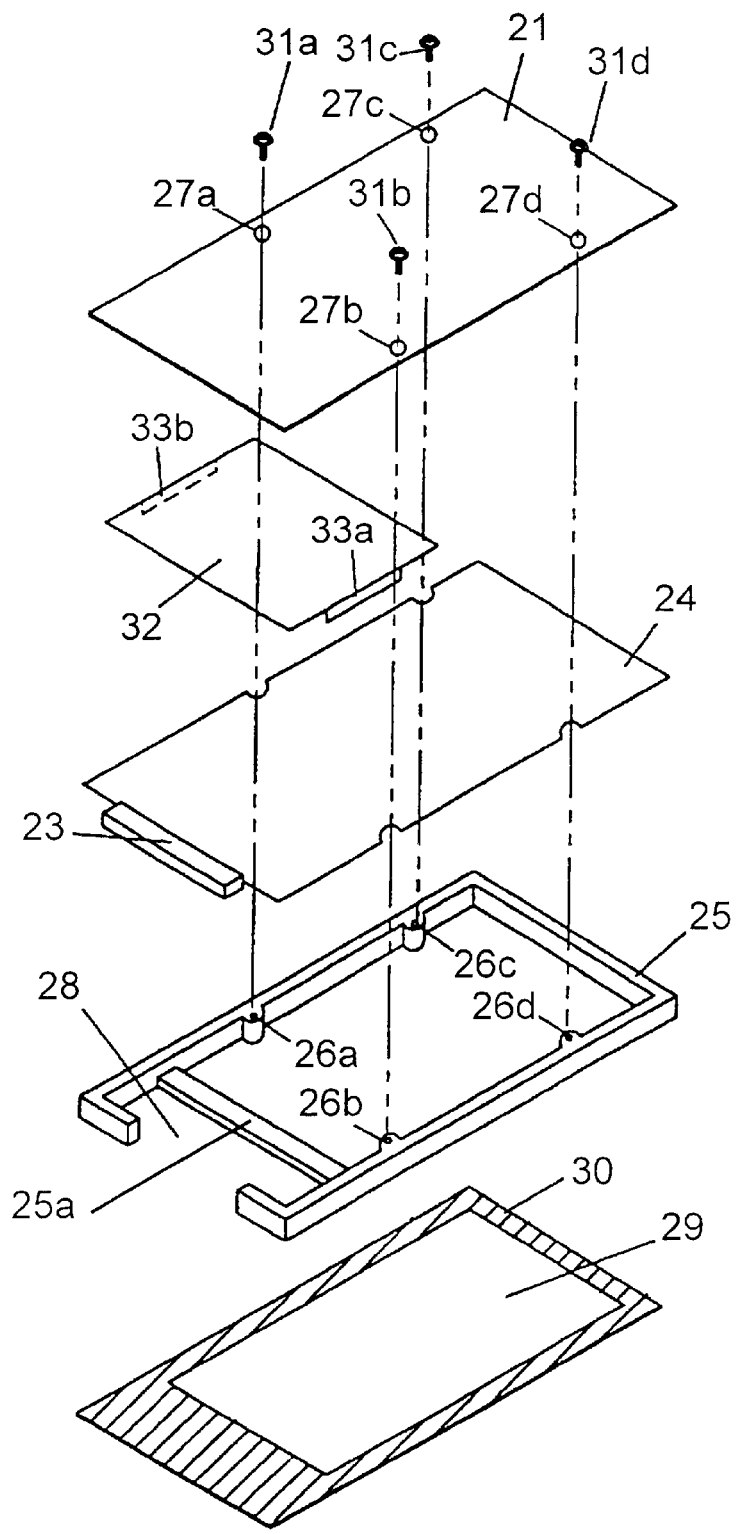
FIG. 1 is a perspective exploded view of a portable terminal device in accordance with exemplary Embodiment 1 of the present invention during assembly thereof.

Exemplary embodiments of the present invention are hereinafter demonstrated with reference to FIG. 1 to 14. In these drawings, same members are denoted with the same reference numerals and same descriptions are omitted for simplicity.

(Embodiment 1)

Figure 2:
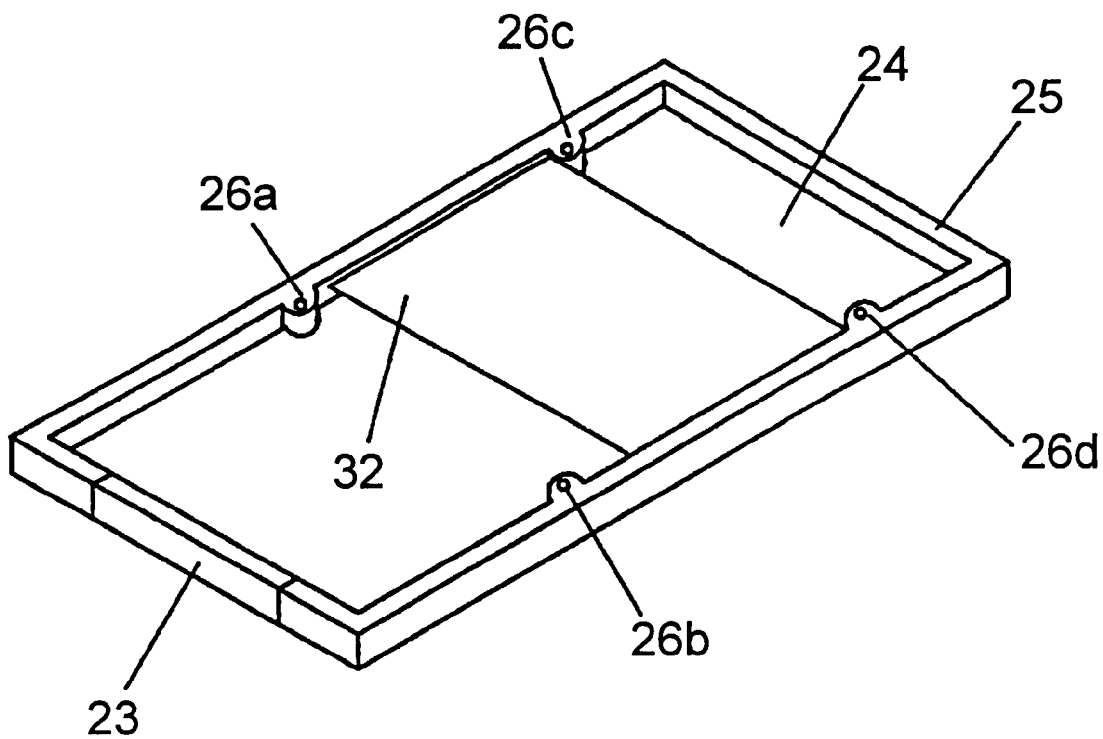
FIG. 2 shows the portable terminal device of FIG. 1 with its top cover taken away.

FIG. 1 shows the structure of a PC card, as an example of a portable terminal device in accordance with Embodiment 1 of the present invention. Reference numeral 21 indicates a top cover having holes 27a to 27d formed therethrough. Reference numeral 23 indicates a connector for connection to external equipment, reference numeral 24 indicates a circuit board having connector 23 attached thereto, and reference numeral 25 indicates a frame for receiving circuit board 24 therein. Reference numeral 25a indicates a bracket member extending between opposing sides of frame 25. Reference numerals 26a to 26d indicates bosses provided at the positions corresponding to respective holes 27a to 27d, and reference numeral 28 indicates a fitting part receiving connector 23 therein. Reference numeral 29 indicates a bottom cover fitting to from 25 and reference numeral 30 indicates an adhesive tape for bonding bottom cover 29 and frame 25 together and provided on bottom cover 29 so as to substantially correspond to the shape of frame 25. Reference numerals 31a to 31d indicate screws for securing to cover 21 and frame 25 together. Reference numeral 32 indicates a reinforcement member and reference numeral 33a indicates a wall folded downwardly from reinforcement member 32. At the position symmetrical to this wall 33a, wall 33b of the same shape as wall 33a is provided. These walls 33a and 33b are structure so as to be in contact with the inner walls of frame 25 when reinforcement member 32 is fitted into frame 25. FIG. 2 shows the PC card with its top cover taken away the steps taken in assembling the PC card are described below. 1) Fit circuit board 24 having connector 23 attached thereto into frame 25 so that fitting part 28 receives connector 23. Then fit reinforcement member 32 into frame 25 so that walls 33a and 33b of reinforcement member 32 are placed on outer edges of circuit board 24 and in contact with the inner walls of frame 25 as shown FIG. 2. 2) Fit top cover 21 to frame 25 so that holes 27a to 27 d correspond to bosses 26a to 26 d, respectively. Then secure top cover 21 and frame 25 together using screws 31a to 31d. 3)Bond adhesive tape 30 to frame 25 so that bottom cover 29 is fitted and secured to frame 25 on the opposite side of top cover 21. The PC card constructed as above is connected to electronic equipment such as a personal computer via connector 23 to impart user's intended value-added functions to the electronic equipment, or to be used as external memory means. Moreover, being portable, this PC card be used for the electronic equipment at anytime and any place, both indoors and outdoors, with the above-mentioned functions imparted. Since reinforcement member 32 supports frame 25, the mechanical strength of frame 25 has improved more than the initial one. When external force applied to the PC card is within the mechanical strength of frame 25 supported by reinforcement member 32, the influence of the external force can be suppressed by the frame 25 supported by reinforcement member 32. Therefore, frame 25 will not be bent or kinked and circuit board 24 within frames 25 can be protected. As mentioned above, the structure of the portable terminal device in accordance with Embodiment 1 can improve the rigidity of frame 25 and minimize the influence of external force on circuit board 24. Thus breakage of the connection between electronic component and circuit board 24 is prevented and a portable terminal device with high reliability can be provided. The shapes of the reinforcement member are not limited to that described in this embodiment. The shapes including the size and positions of the portions in contact with the frame can arbitrarily be selected as long as the shapes are effective in implementation of the invention. It is apparent that the same effect can be obtained by this invention not only in a PC card but also in a portable terminal device with the similar structure. The method of securing to cover 21 and bottom cover 29 to frame 25 is not limited to that described in this embodiment. Fitting to frame 25 by heat welding or using lugs projecting from frame 25 can be used.

(Embodiment 2)

Figure 3:
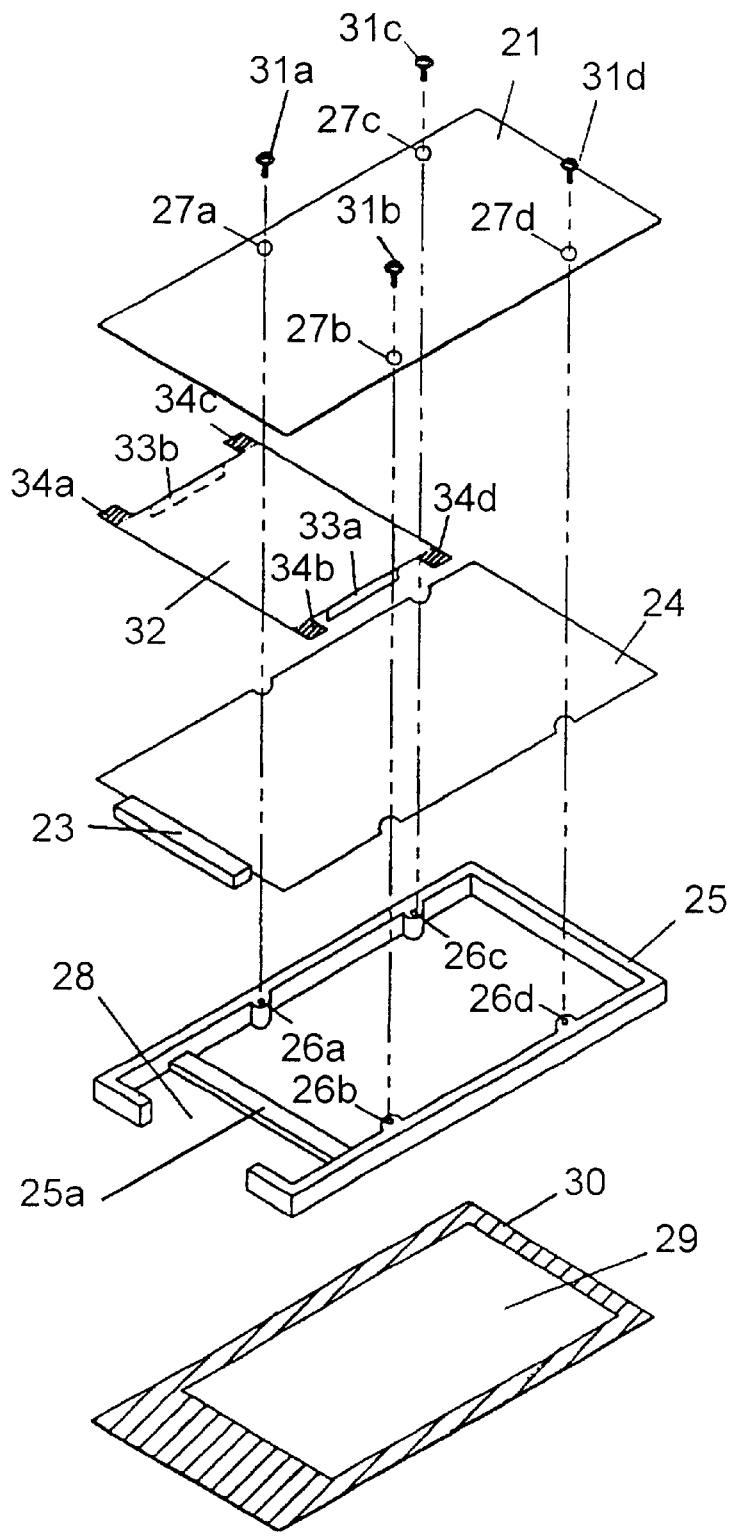
FIG. 3 is a perspective exploded view of a portable terminal device in accordance with exemplary Embodiment 2 of the present invention during assembly thereof.
Figure 4:
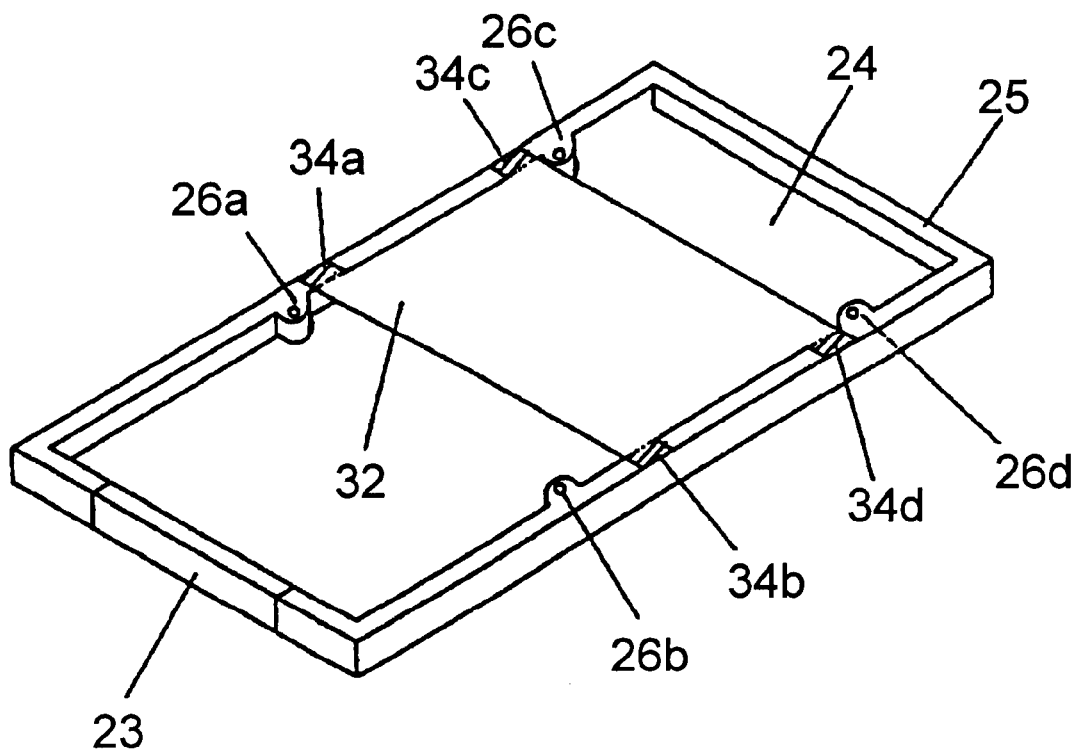
FIG. 4 shows the portable terminal device of FIG. 3 with its top cover taken away.

FIG. 3 shows the structure of a PC card, as an example of a portable terminal device in accordance with Embodiment 2 of the present invention. Reference numerals 34a to 34d indicate arms to be sandwiched between top cover 21 and frame 25 when top cover 21 and frame 25 are secured together using screws 31a to 31d. FIG. 4 shows the PC card with its top cover taken away. The steps taken in assembling the PC card are described below. 1) Fit circuit board 24 having connector 23 attached thereto into frame 25 so that fitting part 28 receives connector 23 therein. Then fit reinforcement member 32 into frame 25 so that walls 33a and 33b of reinforcement member 32 are placed on outer edges of circuit board 24 and in contact with the inner walls of frame 25. In this condition, arms 34a to 34d are at the positions to be sandwiched between frame 25 and top cover 21 as shown in FIG. 4. 2) Fit top cover 21 to frame 25 so that holes 27a to 27d correspond to bosses 26a to 26d, respectively. Then secure top cover 21 and frame 25 together using screws 31a to 31d. At this time, arms 34a to 34d are sandwiched between top cover 21 and frame 25. 3) Fix bottom cover 29 in a manner similar to that of Embodiment 1. Since reinforcement member 32 supports the frame by being sandwiched between frame 25 and top cover 21 as well as using walls 33a and 33b thereof, the mechanical strength of frame 25 has improved more than the initial one. When external force is applied to the PC card, circuit board 24 within frame 25 is protected in a manner similar to that of Embodiment 1. As mentioned above, the structure of the portable terminal device in accordance with Embodiment 2 allows further improvement in the rigidity of frame 25; thus a portable terminal device with higher reliability can be provided. In addition to this embodiment, any portion of reinforcement member 32 can support circuit board 24. As mentioned in Embodiment 1, the shapes of the reinforcement member are not limited to that described in this embodiment.

(Embodiment 3)

Figure 5:
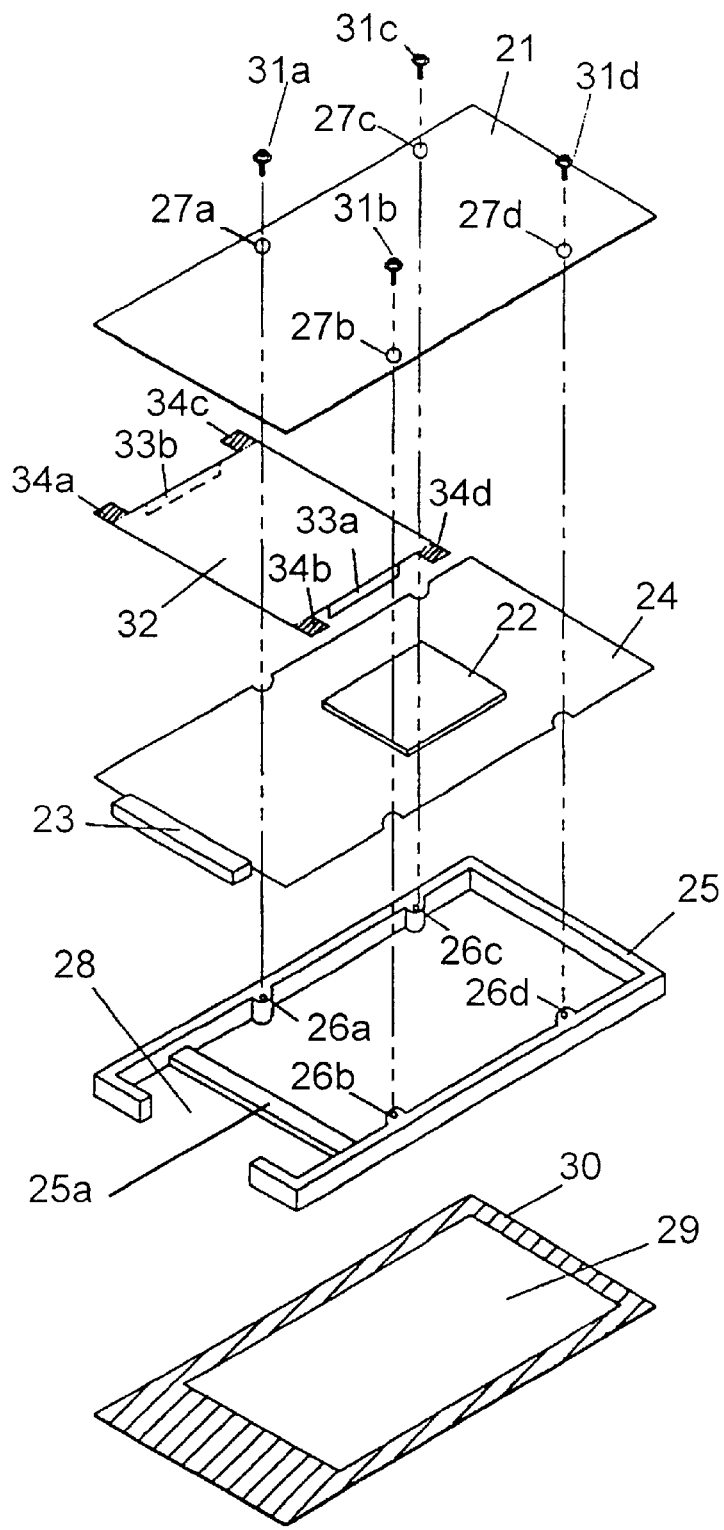
FIG. 5 is a perspective exploded view of a portable terminal device in accordance with exemplary Embodiment 3 of the present invention during assembly thereof.
Figure 6:
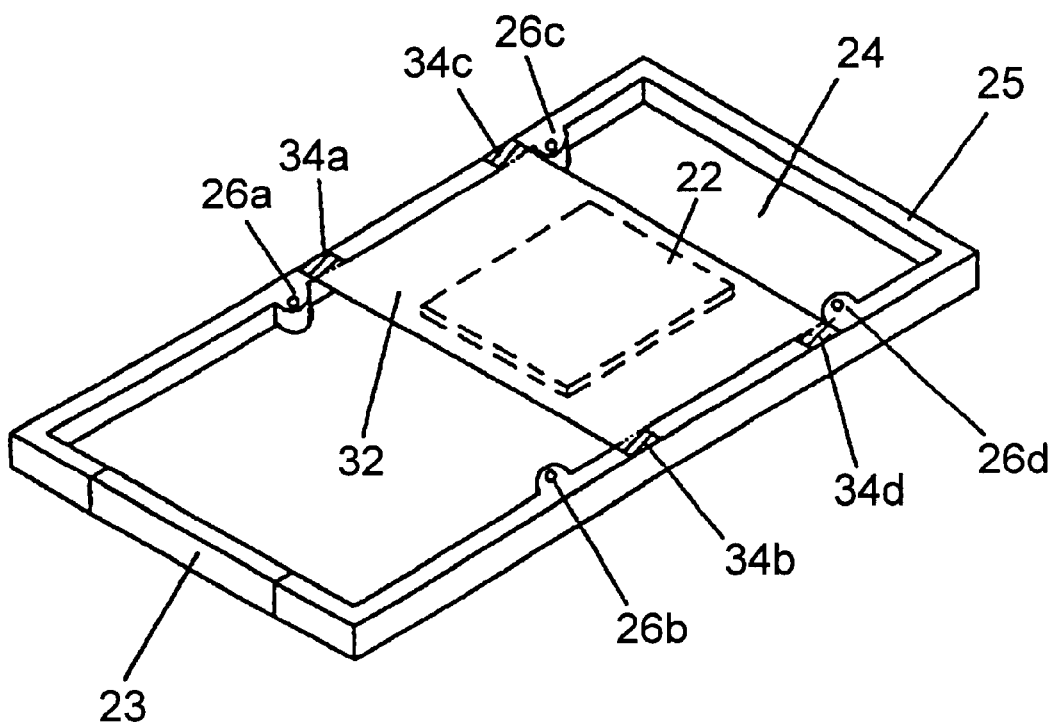
FIG. 6 shows the portable terminal device of FIG. 5 with its top cover taken away.

FIG. 5 shows the structure of a PC card, as an example of a portable terminal device in accordance with Embodiment 3 of the present invention. Reference numeral 22 indicates an area-coupling-component, such as CSP (chip size package) and BGA (ball grid array), mounted on circuit board 24. FIG. 6 shows the PC card with its top cover taken away. The steps taken in assembling the PC card are described below. 1) Fit circuit board 24 having area-coupling-component 22 and connector 23 attached thereto into frame 25 so that fitting part 28 receives connector 23. 2) Fit reinforcement member 32 to frame 25 so that reinforcement member 32 covers area-coupling-component 22 and walls 33a and 33b are placed on the outer edges of circuit board 24 and in contact with the inner walls of frame 25. In this condition, arms 34a to 34d are placed on frame 25 as shown in FIG. 6. 3) Thereafter, follow the same steps taken in Embodiment 2. When external force is applied to the PC card, circuit board 24 within frame 25, especially the portion around area-coupling-component 22 is securely protected in a manner similar to that of Embodiment 2. As mentioned above, the structure of the portable terminal device in accordance with Embodiment 3 improves the rigidity of frame 25 and also minimizes the influence of external force on area-coupling-component 22; thus breakage of the microconnection is prevented and a portable terminal device with higher reliability can be provided. Shown in this embodiment is an example of placing reinforcement member 32 over area-coupling-component 22. However, the reinforcement member can be placed over the surroundings of area-coupling-component 22 including a portion just under the component on the opposite face of circuit board 24. In addition to this embodiment, any portion of reinforcement member 32 can support circuit board 24. As mentioned in Embodiment 1, the shapes of the reinforcement member are not limited to that described in this embodiment.

(Embodiment 4)

Figure 7:
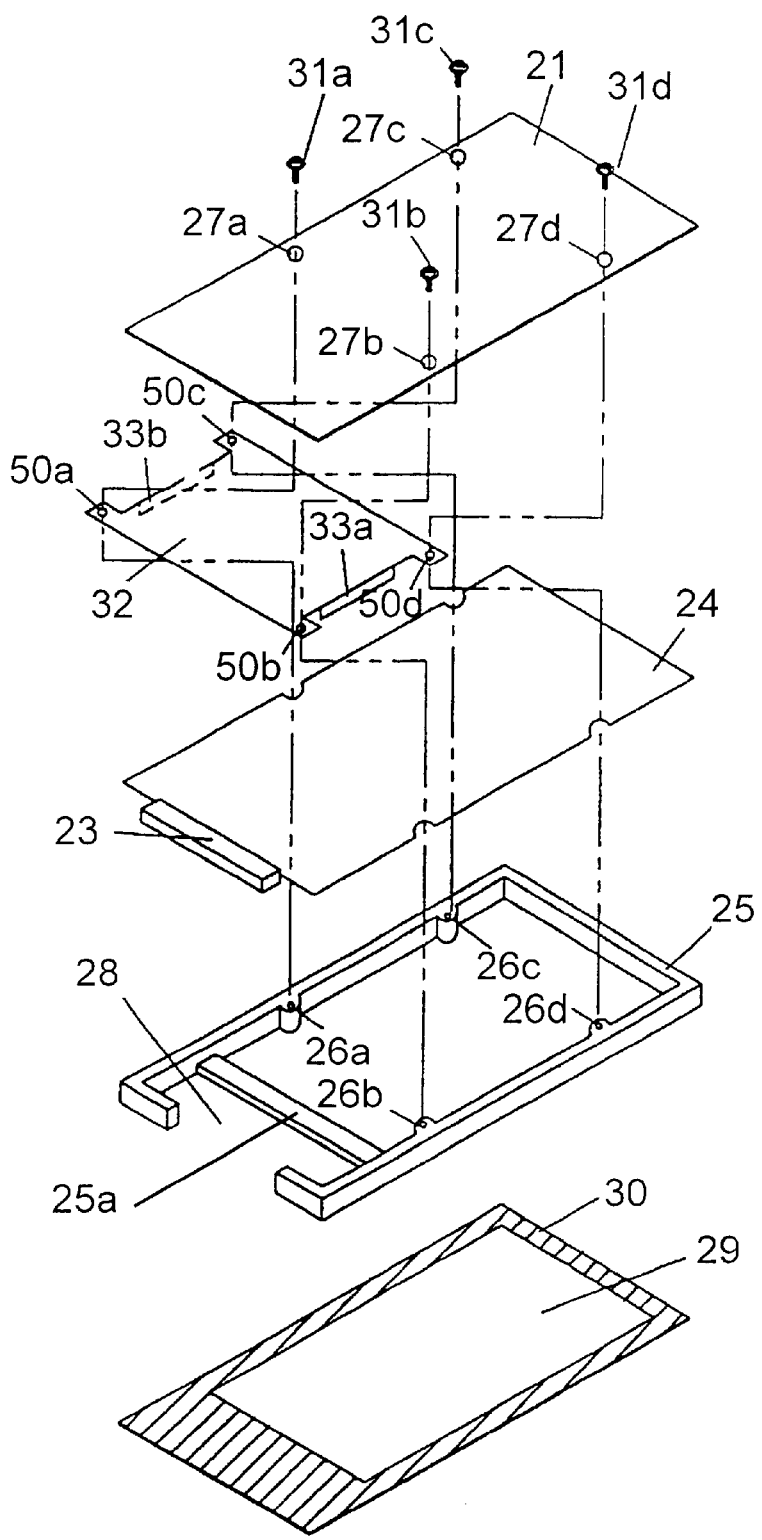
FIG. 7 is a perspective exploded view of a portable terminal device in accordance with exemplary Embodiment 4 of the present invention during assembly thereof.
Figure 8:
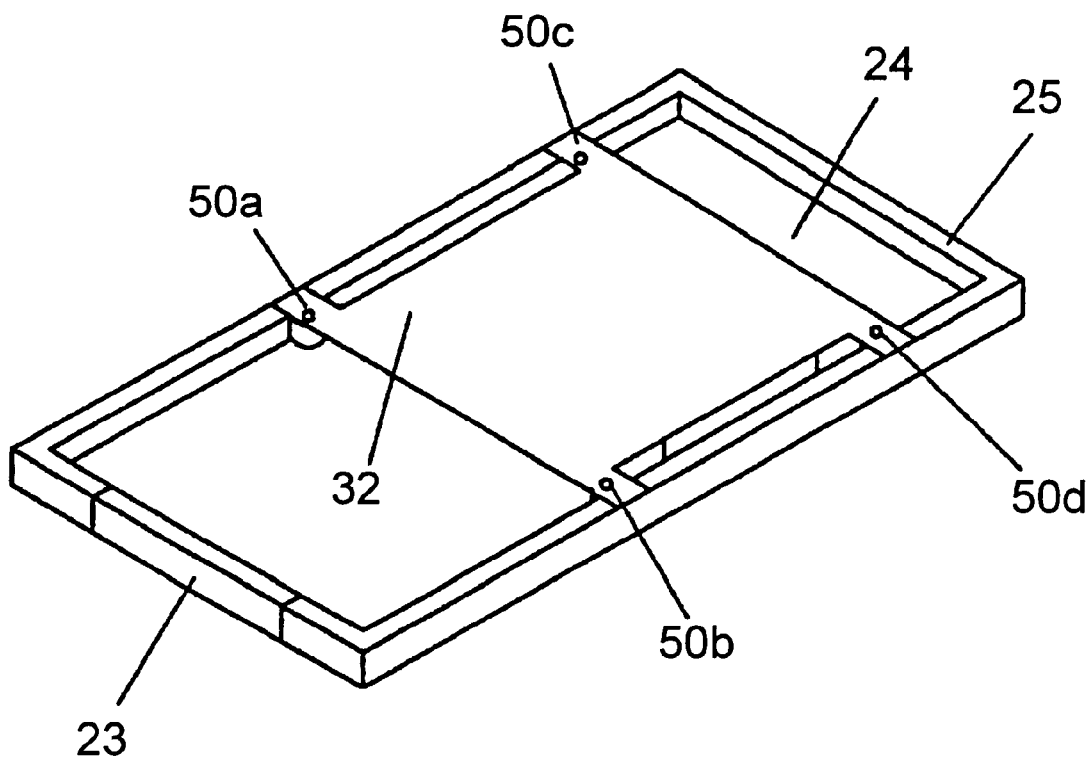
FIG. 8 shows the portable terminal device of FIG. 7 with its top cover taken away.

FIG. 7 shows the structure of a PC card, as an example of a portable terminal device in accordance with Embodiment 4 of the present invention. Reference numerals 50a to 50d indicate holes provided through reinforcement member 32 and at positions corresponding to holes 27a to 27d through top cover 21 and bosses 26a to 26d in frame 25, respectively. FIG. 8 shows the PC card with its top cover taken away. The steps taken in assembling the PC card are described below. 1) Fit circuit board 24 having connector 23 attached thereto into frame 25 so that fitting part 28 receives connector 23 therein. 2) Fit reinforcement member 32 to frame 25 so that walls 33 a and 33b of reinforcement member 32 are placed on the outer edges of circuit board 24 and in contact with the inner walls of frame 25, and at the same time, bosses 26a to 26d in frame 25 correspond to holes 50a to 50d, respectively. FIG. 8 shows the PC card in this condition. 3) Fit top cover 21 to frame 25 so that holes 27a to 27d correspond to holes 50a to 50d, respectively. Then secure top cover 21 and frame 25 together using screws 31a to 31d. 4) As for bottom cover 29, follow the same steps taken in Embodiment 1. Since frame 25 and reinforcement member 32 are mechanically secured each other, the strength of frame 25 has improved more than the initial one. When external force applied to the PC card is within the mechanical strength of frame 25 integral with reinforcement member 32, the influence of the external force can be suppressed by the frame 25 integral with reinforcement member 32. Therefore, frame 25 will not be bent or kinked by greater external force and circuit board 24 within frame 25 can be protected. As mentioned above, the structure of the portable terminal device in accordance with Embodiment 4 drastically improves the rigidity of frame 25 and further reduces the influence of external force on circuit board 24; thus a portable terminal device with high reliability can be provided in a manner similar to that of Embodiment 1. Shown in this embodiment is an example of reinforcement member 32 secured by the screws. However, any securing method other than screws, such as fitting frame 25 by heat welding or with lugs projecting from frame 25, can be used instead. In addition to this embodiment, any portion of reinforcement member 32 can support circuit board 24. As mentioned in Embodiment 1, the shapes of the reinforcement member are not limited to that described in this embodiment.

(Embodiment 5)

Figure 9:
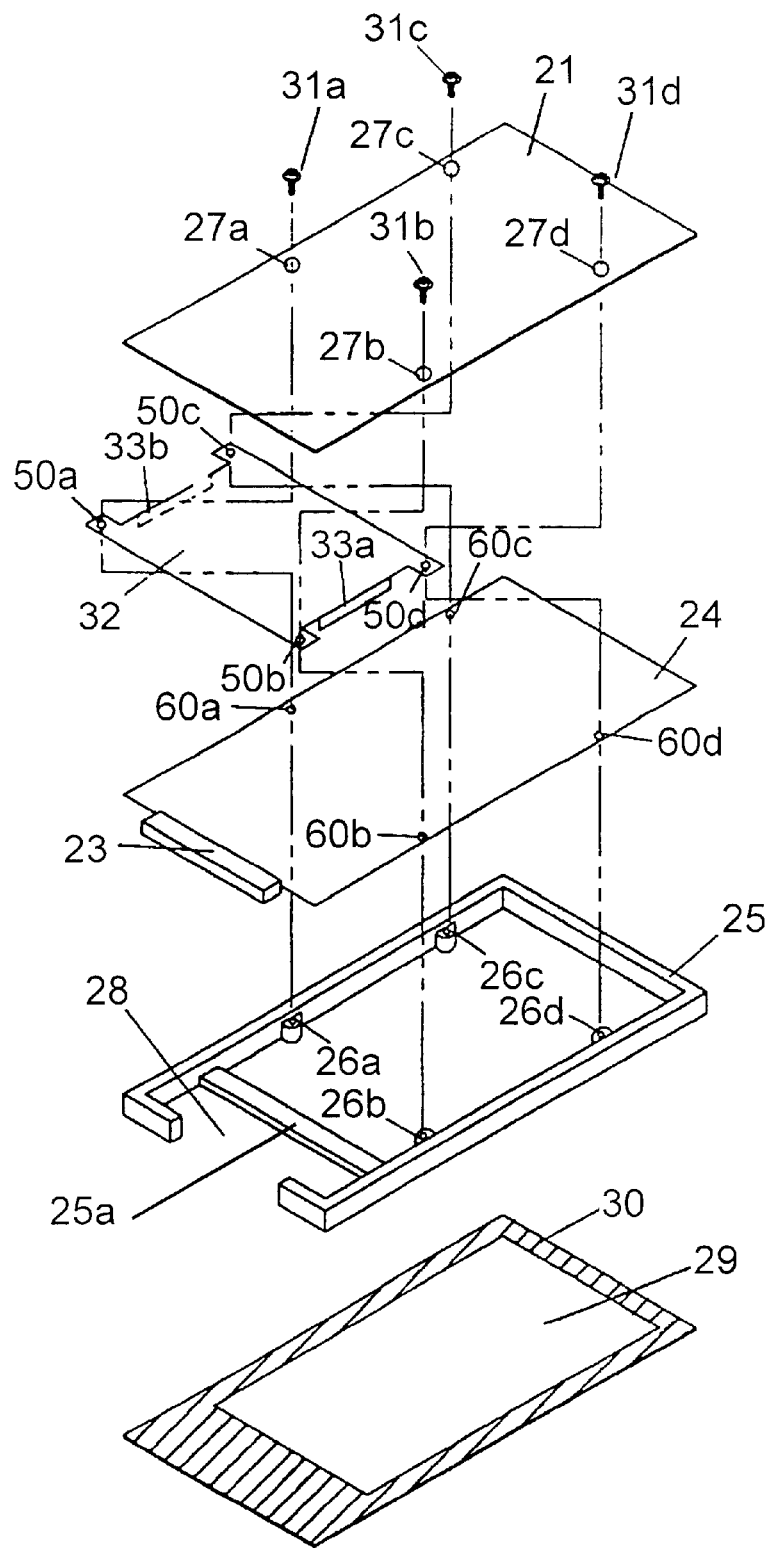
FIG. 9 is a perspective exploded view of a portable terminal device in accordance with exemplary Embodiment 5 of the present invention during assembly thereof.

FIG. 9 shows the structure of a PC card, as an example of a portable terminal device in accordance with Embodiment 5 of the present invention. Reference numerals 60a to 60d indicate holes provided through circuit board 24 and at positions corresponding to respective bosses 26a to 26d in frame 25. The steps taken in assembling the PC card are described below. 1) Fit circuit board 24 having connector 23 attached thereto into frame 25 so that fitting part 28 receives connector 23 therein and holes 60a to 60d correspond to bosses 26a to 26d in frame 25, respectively. 2) Fit reinforcement member 32 to frame 25 so that walls 33a and 33b of reinforcement member 32 are placed on the outer edges of circuit board 24 and in contact with the inner walls of frame 25, and at the same time, holes 60a to 60d in circuit board 24 correspond to holes 50a to 50d, respectively. 3) Fit top cover 21 to frame 25 so that holes 27a to 27d correspond to holes 50a to 50d, respectively. Then secure top cover 21 and frame 25 together using screws 31a to 31d. 4) As for bottom cover 29, follow the same steps taken in Embodiment 1. Since frame 25, reinforcement member 32, and circuit board 24 are mechanically secured in this embodiment, the strength of frame 25 has improved than the initial one. When external force applied to the PC card is within the mechanical strength of frame 25 integral with reinforcement member 32 and circuit board 24, the influence of the external force can be suppressed by frame 25. Therefore, frame 25 and circuit board 24 will not be bent or kinked by much greater external force and circuit board 24 within frame 25 can be protected. As mentioned above, the structure of the portable terminal device in accordance with Embodiment 5 can drastically reduce the influence of external force on circuit board 24; thus a portable terminal device with high reliability can be provided in a manner similar to that of Embodiment 1. Shown in this embodiment is an example of circuit board 24 and reinforcement member 32 secured by screws. However, any securing method other than screws, such as fitting frame 25 by heat welding or with lugs projecting from frame 25, can be used instead. As mentioned in Embodiment 1, the shapes of the reinforcement member are not limited to that described in this embodiment.

(Embodiment 6)

Examples of the structure of a terminal device in accordance with Embodiment 6 are not illustrated. Providing a metallic reinforcement member in the devices in accordance with Embodiments 1 to 5 drastically improves the mechanical strength of reinforcement member 32 itself; therefore the mechanical strength of frame 25 supported by metallic reinforcement member 32 has improved more than the initial one thereof. The structure of the portable terminal device in accordance with Embodiment 6 can provide a portable terminal device with much higher reliability.

(Embodiment 7)

Figure 10:
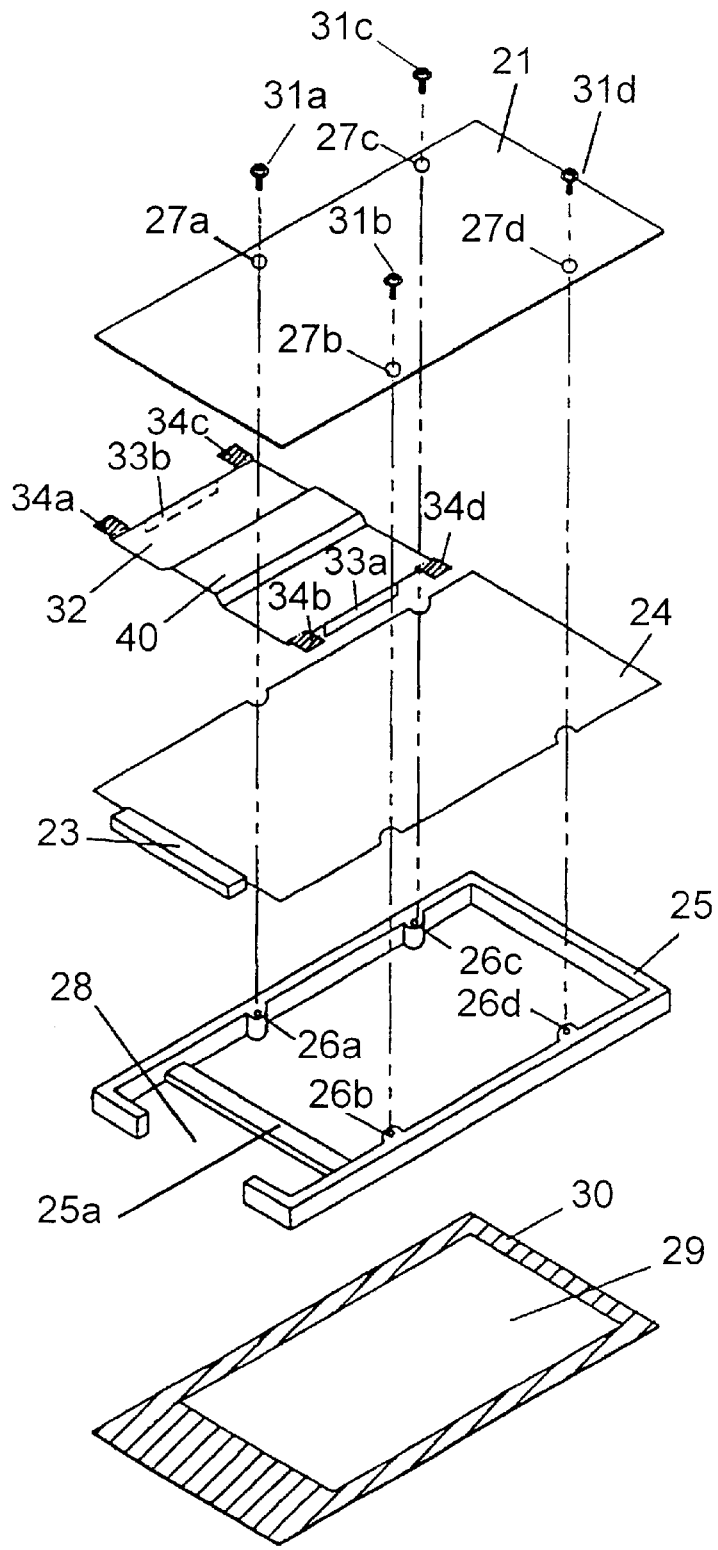
FIG. 10 is a perspective exploded view of a portable terminal device in accordance with exemplary Embodiment 7 of the present invention during assembly thereof.
Figure 11:
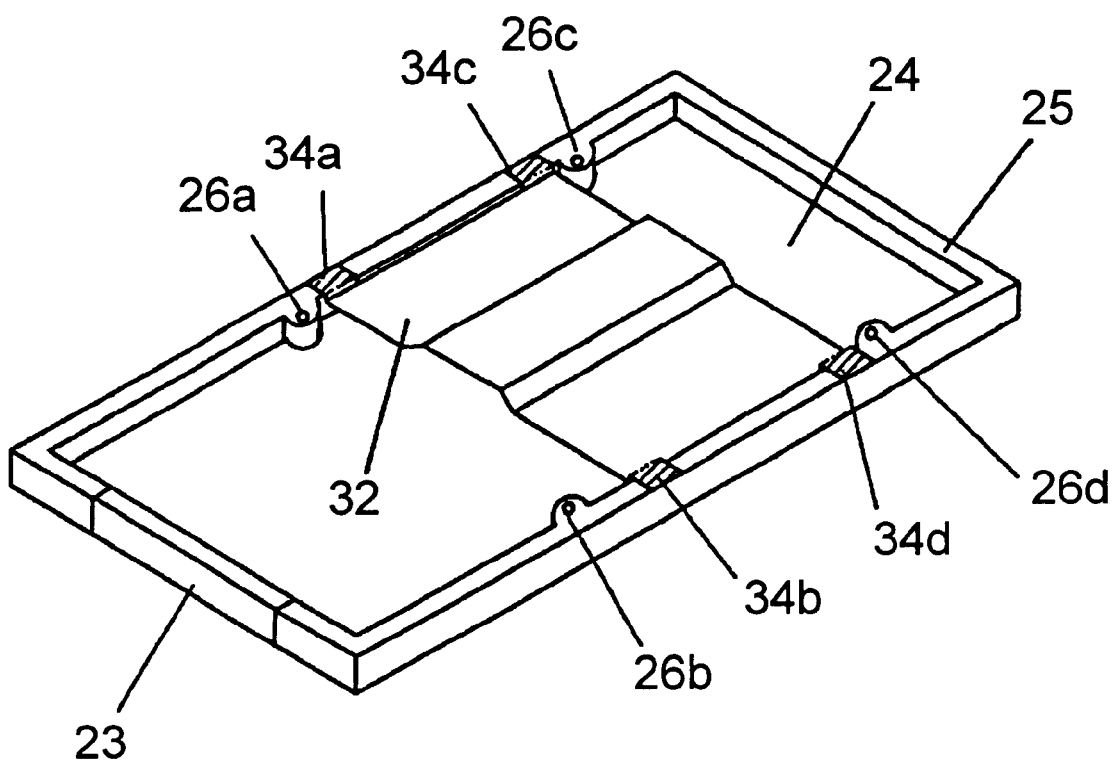
FIG. 11 shows the portable terminal device of FIG. 10 with its top cover taken away.
Figure 12:
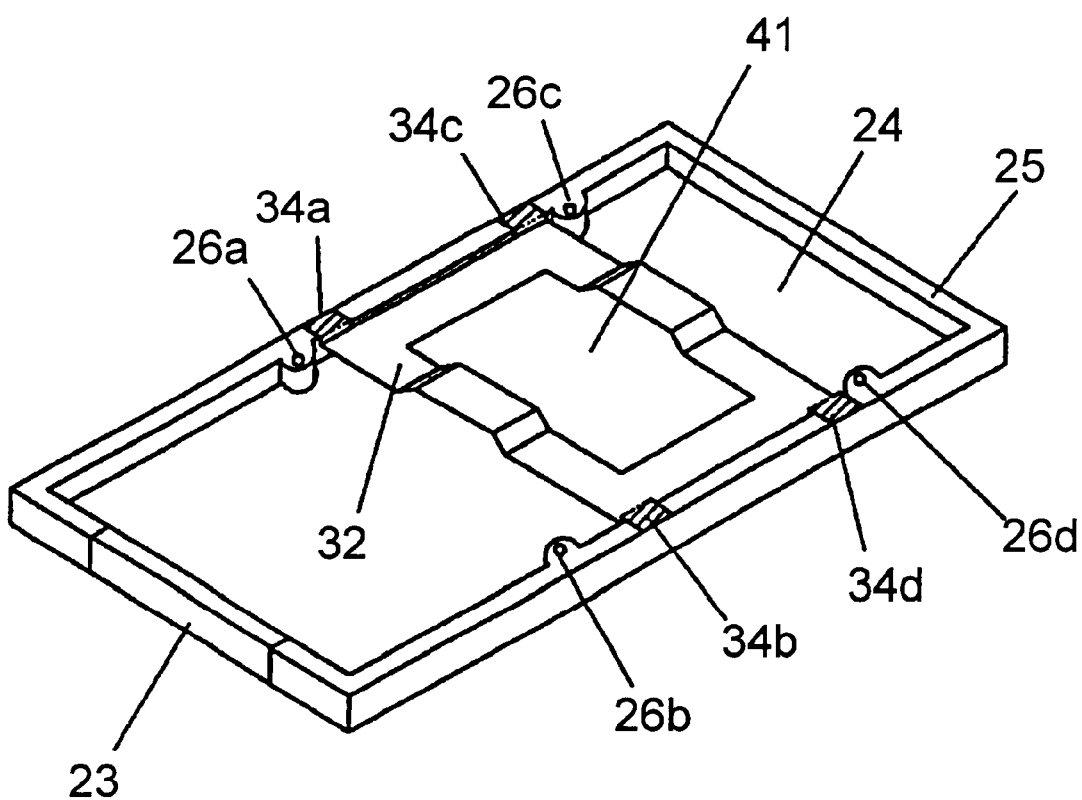
FIG. 12 shows another example of the portable terminal device of FIG. 11.

FIG. 10 shows the structure of a PC card, as an example of a portable terminal device in accordance with Embodiment 7 of the present invention. Reference numeral 40 indicates a drawn part formed on metallic reinforcement member 32 by drawing. FIG. 11 shows the PC card with its top cover taken away. FIG. 12 shows another example of a PC card with its top cover taken away. Reference numeral 41 indicates a space provided in reinforcement member 32. In assembling the PC card, follow the same steps taken in Embodiment 2. Drawn part 40 has imparted to metallic reinforcement member 32 a strength improved more than that metallic reinforcement member 32 originally has; therefore the mechanical strength of frame 25 supported by reinforcement member 32 has improved more than the initial one thereof. When external force is applied to the PC card, circuit board 24 within frame 25 is protected in a similar manner to that of Embodiment 2. In addition, the structure shown in FIG. 12 is effective in reducing the weight of the portable terminal device itself by space 41. As mentioned above, the structure of the portable terminal device in accordance with Embodiment 7 can improve the rigidity of frame 25 and further reduce the influence of external force on circuit board 24; thus a portable terminal device with much higher reliability can be provided. Moreover, placing space 41 in the reinforcement member can provide a light and easy-to-use portable terminal device. In addition to this embodiment, any portion of reinforcement member 32 can support circuit board 24. As mentioned in Embodiment 1, the shapes of the reinforcement member are not limited to that described in this embodiment.

(Embodiment 8)

Figure 13:
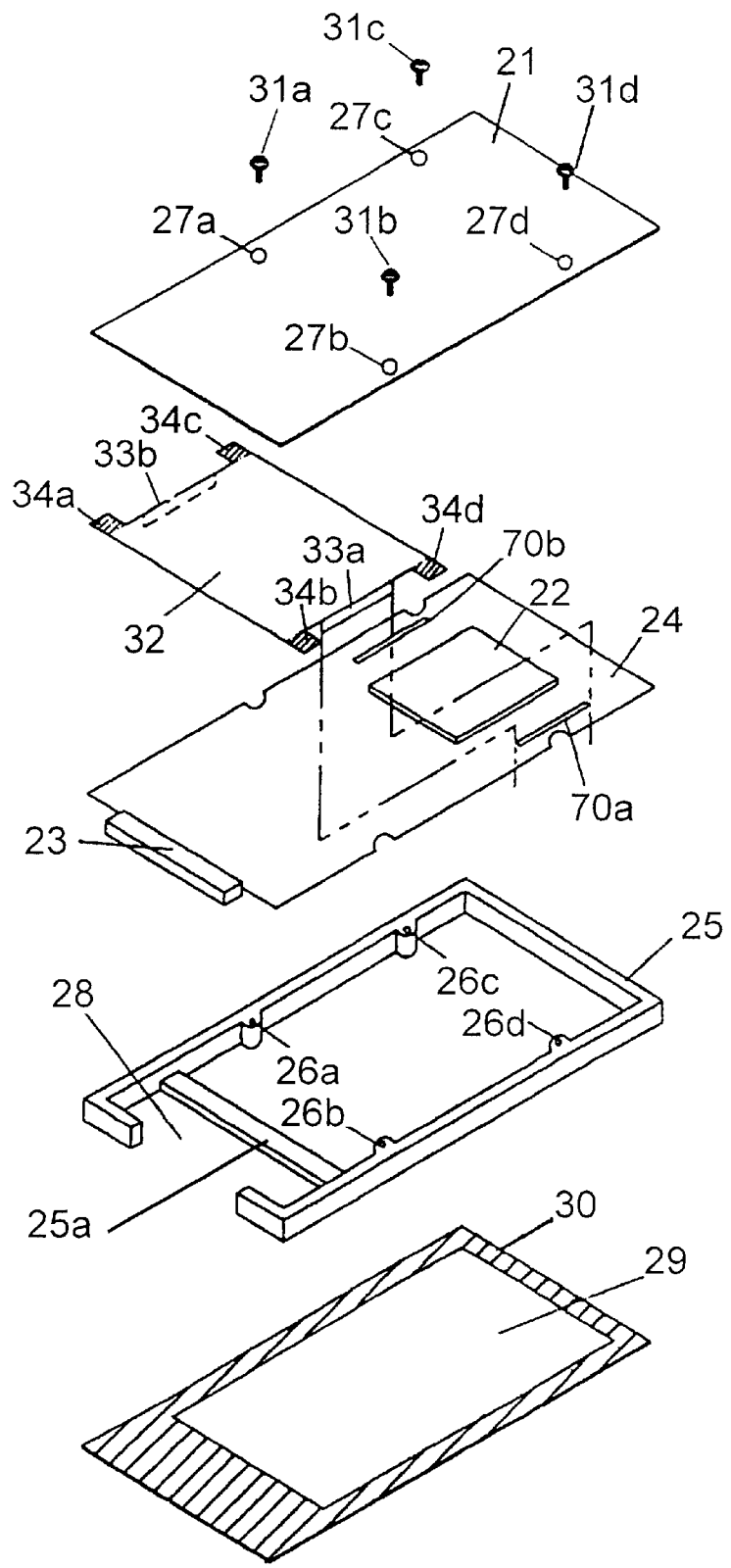
FIG. 13 is a perspective exploded view of a portable terminal device in accordance with exemplary Embodiment 8 of the present invention during assembly thereof.

FIG. 13 shows the structure of a PC card, as an example of a portable terminal device in accordance with Embodiment 8 of the present invention. Reference numerals 70a and 70b indicate fixing slots provided in circuit board 24 at positions in proximity of area-coupling-component 22 and having a configuration so as to receive respective walls 33a and 33b of reinforcement member 32 into the corresponding fixing slots at the same time. Provided around the fixing slots is copper foil for soldering. The steps taken in assembling the PC card are described below. 1) Insert walls 33a and 33b of metallic reinforcement member 32 into fixing slots 70a and 70b in circuit board 24, respectively. The PC card is structured so that area-coupling-component 22 is covered by reinforcement member 32 at that time. In this condition, fix walls 33a and 33b and the portion on circuit board 24 around fixing slots 70a and 70b together by soldering. At this time, walls 33a and 33b may be soldered to the ground patterns on circuit board 24. 2) Fit circuit board 24 integral with metallic reinforcement member 32 into frame 25 so that connector 23 is fitted in fitting part 28. In this condition, arms 34a to 34d are at the positions to be sandwiched between frame 25 and top cover 21. 3) Thereafter, follow the steps completely same as those taken in Embodiment 2. Since circuit board 24 and metallic reinforcement member 32 are mechanically secured together, the strength of circuit board 24 has improved more than the initial one. Moreover, since circuit board 24 and metallic reinforcement member 32 integral with each other support frame 25, the mechanical strength of frame 25 has improved more than the initial one. When external force applied to the PC card is within the mechanical strength of frame 25 supported by integrated circuit board 24 and metallic reinforcement member 32, the influence of the external force can be suppressed by the frame 25. Therefore, frame 25 will not be bent or kinked by much greater external force and circuit board 24 within frame 25 can be protected. As mentioned above, the structure of the portable terminal device in accordance with Embodiment 8 can drastically improve the rigidity of frame 25 and further reduce the influence of external shocks on circuit board 24. Especially, the structure allows secure protection of the surroundings of area-coupling-component 22; thus a portable terminal device with higher reliability can be provided. In this embodiment, the device is structured to have arms 34a to 34d sandwiched between top cover 21 and frame 25. However, the device can be structured so that walls 33a and 33b are simply soldered to fixing slots 70a and 70b in circuit board 24, respectively, without arms 34a to 34d. Thus the mechanical strength of circuit board 24 integral with metallic reinforcement member 32 improves more than that of circuit board 24 itself. Consequently, when external force applied to the PC card is within the mechanical strength of circuit board 24 integral with metallic reinforcement member 32, the influence of the external force can be suppressed. Shown in this embodiment is an example of placement of reinforcement member 32 covering area-coupling-component 22. The reinforcement member can be placed over the surroundings of area-coupling-component 22 including a portion just under the component on the opposite face of circuit board 24. As mentioned in Embodiment 1, the shapes of the reinforcement member are not limited to that described in this embodiment.

(Embodiment 9)

Figure 14:
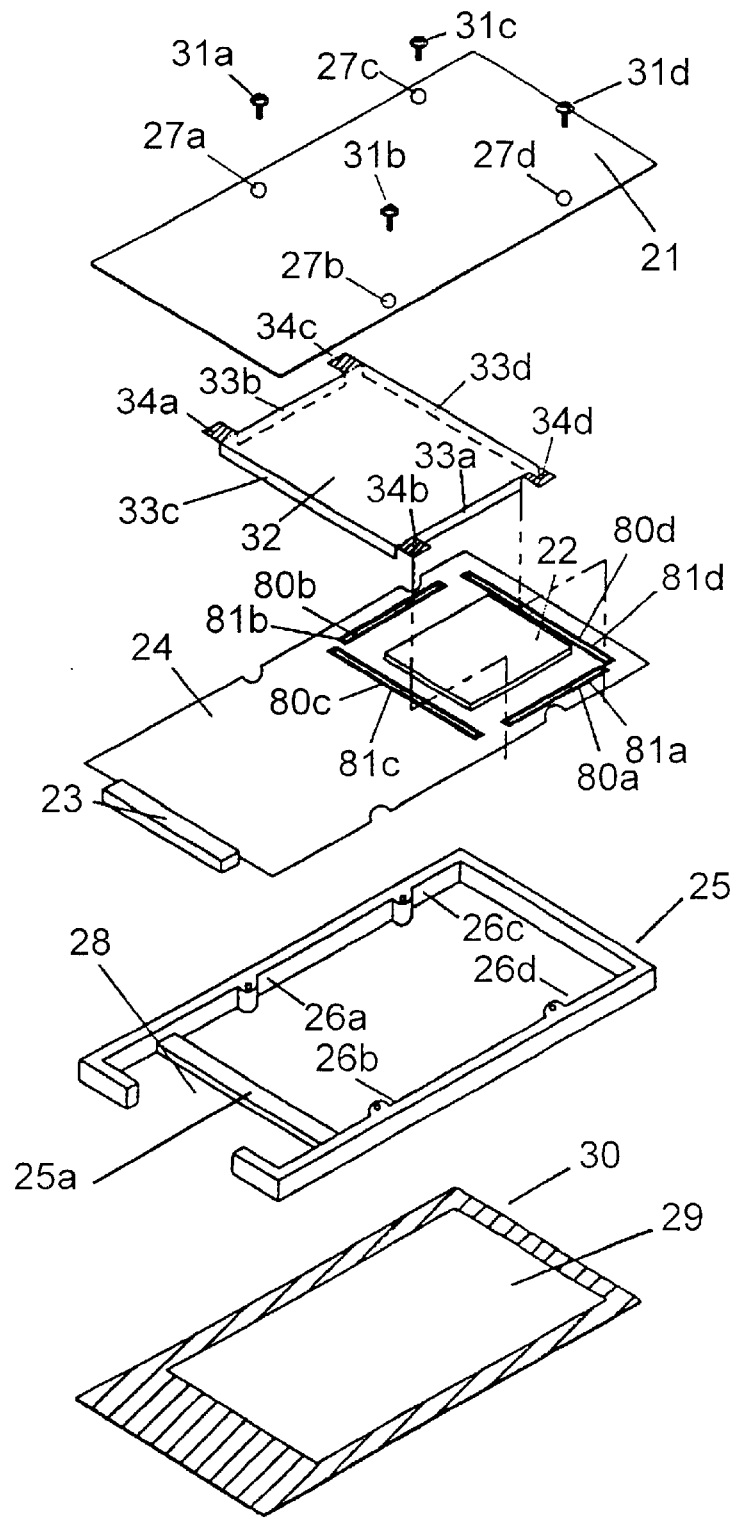
FIG. 14 is a perspective exploded view of a portable terminal device in accordance with exemplary Embodiment 9 of the present invention during assembly thereof.
Figure 15:
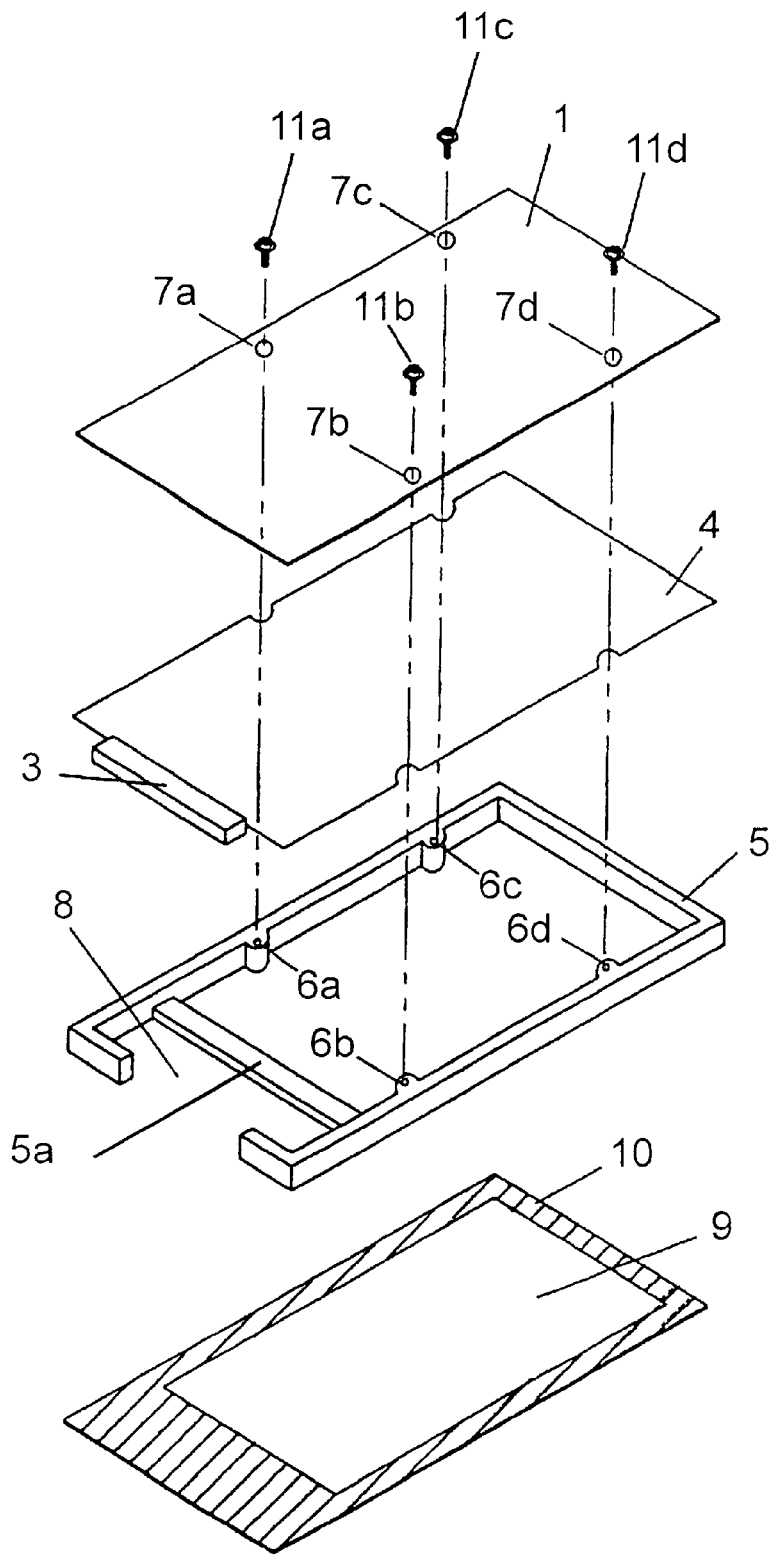
FIG. 15 is a perspective exploded view of a conventional portable terminal device during assembly thereof.
Figure 16:
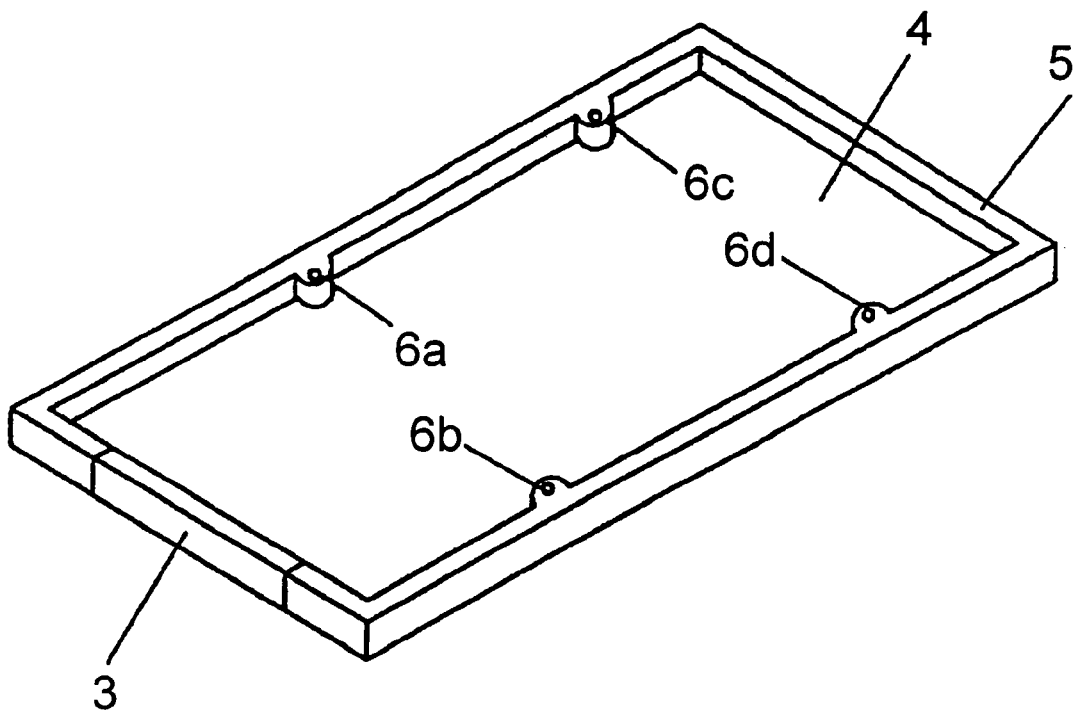
FIG. 16 shows the portable terminal device of FIG. 15 with its top cover taken away.

FIG. 14 shows the structure of a PC card, as an example of a portable terminal device in accordance with Embodiment 9 of the present invention. Reference numerals 33a to 33d indicate walls folded downwardly from the portions other than arms 34a to 34d of metallic reinforcement member 32. Reference numerals 80a to 80d indicate fixing slots provided in circuit board 24 at positions surrounding area-coupling-component 22 and having a configuration so as to receive walls 33a to 33d of reinforcement member 32 into the corresponding fixing slots at the same time. Reference numerals 81a to 81d indicate ground patterns exposed on circuit board 24 around respective fixing slots 80a to 80d. The steps taken in assembling the PC card are described below. 1) Insert walls 33a to 33d of metallic reinforcement member 32 into fixing slots 80a to 80d in circuit board 24, respectively. The PC card is structured so that reinforcement member 32 covers area-coupling-component 22 at this time. In this condition, fix walls 33a to 33d and the ground patterns 81a to 81d on circuit board 24 together by soldering. 2) Fit circuit board 24 integral with metallic reinforcement member 32 into frame 25 so that connector 23 is fitted in fitting part 28. In this condition, arms 34a to 34d are at the positions to be sandwiched between frame 25 and top cover 21. 3) Thereafter, follow the steps completely same as those taken in Embodiment 2. When external force is applied to the PC card, frame 25 will not be bent or kinked even by greater force and circuit board 24 within frame 25 can be protected. Metallic reinforcement member 32 connected to ground patterns 81a to 81d also serve as a shield. In other words, high-frequency waves and the like emitting from the outside of the portable terminal device or on circuit board 24 are transferred to ground patterns 81a to 81d through metallic reinforcement member 32. Similarly, high-frequency emissions from area-coupling-component 22 are transferred to ground patterns 81a to 81d. Thus the reinforcement member prevents malfunctions and deterioration of the functions caused by parasitic emission. As mentioned above, the structure of the portable terminal device in accordance with Embodiment 9 can further reduce the influence of external force on circuit board 24, securely protect the portion especially around area-coupling-component 22, and moreover provide an effective countermeasure against parasitic emission. Therefore, a portable terminal device having high mechanical strength and functional reliability can be provided. A plurality of walls can be provided in metallic reinforcement member 32 and a plurality of fixing slots and ground patterns corresponding to the respective walls can be provided on circuit board 24 to divide metallic reinforcement member 32 into a plurality of compartments. In this embodiment, the device is structured to have arms 34a to 34d sandwiched between top cover 21 and frame 25. However, the device can be structured so that walls 33a to 33d are simply soldered to fixing slots 80a to 80b in circuit board 24, respectively, without arms 34a to 34d. In addition, metallic reinforcement member 32 can be placed over the surroundings of area-coupling-component 22 including a portion just under the component on the opposite face of circuit board 24. As mentioned in Embodiment 1, the shapes of the reinforcement member are not limited to that described in this embodiment.

(Embodiment 10)

Examples of the structure of a terminal device in accordance with Embodiment 10 are not illustrated. In this embodiment, the structure is similar to that of Embodiment 9 except that top cover 21 is made of metal. In assembling and using the PC card of such a structure, follow the steps taken in Embodiment 9. When external force is applied to the PC card, circuit board 24 within frame 25 is protected in a manner completely similar to that of Embodiment 8. Moreover, metallic reinforcement member 32 connected to ground patterns 81a to 81d also serve as a shield. In other words, high frequency waves and the like emitting from the outside of the portable terminal device or on circuit board 24 is transferred to ground patterns 81a to 81d through metallic reinforcement member 32, and to metallic top cover 21 via arms 34a to 34d. Similarly, high-frequency emission from area-coupling-component 22 is transferred to ground patterns 81a to 81d, and to metallic top cover 21 via and arms 34a to 34d. Thus this structure further prevents malfunctions and deterioration of the functions caused by parasitic emission. As mentioned above, the structure of the portable terminal device in accordance with Embodiment 10 can further reduce the influence of external shocks on circuit board 24, especially protect the surroundings of area-coupling-component 22 securely, and moreover provide an effective countermeasure against parasitic emission. Therefore, a portable terminal device having high mechanical strength and functional reliability can be provided. Like Embodiment 9, a plurality of walls can be provided in metallic reinforcement member 32 and a plurality of fixing slots and ground patterns corresponding to the respective walls can be provided on circuit board 24 to divide metallic reinforcement member 32 into a plurality of compartments. Metallic reinforcement member 32 can be placed over the surroundings of area-coupling-component 22 including a portion just under the component on opposite face of circuit board 24. As means for making contact between metallic top cover 21 and reinforcement member 32, another metallic member can be used. As mentioned in Embodiment 1, the shapes of the reinforcement member are not limited to that described in this embodiment.

What is claimed is:

1. A portable terminal device comprising:
 a circuit board having electronic component mounted thereon;
 a frame for receiving said circuit board therein and for defining an area, said frame having opposing sides;
 a bracket member extending between said opposing sides of said frame;
 a reinforcement member in contact with the frame and for reinforcing said frame and extending over less than the area of said frame, said reinforcement member being spaced from said bracket member; and
 a cover fitted to said frame, wherein said frame and said cover sandwiches said reinforcement member.

2. The portable terminal device as described in claim 1, wherein an area-couping-component, such as BGA (ball grid array) and CSP (chip size package), is mounted on said circuit board and said reinforcement member is provided over surroundings of the area-coupling-component including a portion over said area-coupling-component.

3. The portable terminal device as described in claim 2 wherein said reinforcement member is fixed to said frame.

4. The portable terminal device as described in claim 2 wherein said circuit board is fixed to said frame together with said reinforcement member.

5. The portable terminal device as described in claim 1, wherein said reinforcement member is fixed to said frame.

6. The portable terminal device as described in claim 1, wherein said circuit board is fixed to said frame together with said reinforcement member.

7. The portable terminal device as described in claim 1, wherein a sheet metal is used as said reinforcement member.

8. The portable terminal device as described in claim 7 wherein said reinforcement member has a drawn part.

9. The portable terminal device as described in claim 8 wherein said sheet metal is joined to said circuit board.

10. The portable terminal device as described in claim 8 wherein said sheet metal is provided over electronic component mounted on said circuit board and substantially all circumference of said sheet metal is joined to ground parts on said circuit board.

11. The portable terminal device as described in claim 9 wherein said cover is made of metal and said sheet metal is joined to ground parts on said circuit board and also connected to said cover.

12. The portable terminal device as described in claim 7 wherein said reinforcement member is joined to said circuit board.

13. The portable terminal device as described in claim 12 wherein said cover is made of metal and said sheet metal is joined to ground parts on said circuit board and also connected to said cover.

14. The portable terminal device as described in claim 7 wherein said sheet metal is provided over electronic component mounted on said circuit board and substantially all circumference of said sheet metal is joined to ground parts on said circuit board.

15. The portable terminal device as described in claim 1, wherein said device is a PC (personal computer) card.

16. The portable terminal device as described in claim 1, wherein said frame further includes walls, two opposing walls of said frame each having inwardly extending bosses, and said reinforcement member extends along said opposing walls of said frame only between said bosses.

17. The portable terminal device as described in claim 1, wherein said frame has inner walls, and said reinforcement member occupies a part of an area formed by inner walls.

* * * * *